United States Patent [19]
Doyen et al.

[11] Patent Number: 4,710,729
[45] Date of Patent: Dec. 1, 1987

[54] MICROWAVE OSCILLATOR COMPRISING A DIELECTRIC RESONATOR INSENSITIVE TO MECHANICAL VIBRATIONS

[75] Inventors: Daniel Doyen, Ozoir; Tarcisio Vriz, Montgeron, both of France

[73] Assignee: U.S. Philips Corporation, New York, N.Y.

[21] Appl. No.: 903,048

[22] Filed: Sep. 2, 1986

[30] Foreign Application Priority Data

Sep. 6, 1985 [FR] France .................. 85 13315

[51] Int. Cl.$^4$ .................................... H03B 5/18
[52] U.S. Cl. .................................. 331/96; 331/68; 333/228
[58] Field of Search ............... 331/68, 96, 107 DP, 331/117 D; 333/219, 227, 228, 230; 361/399

[56] References Cited

U.S. PATENT DOCUMENTS 4,639,690  1/1987  Lewis ............................ 331/96

FOREIGN PATENT DOCUMENTS 0929468  12/1947  France .

OTHER PUBLICATIONS

Dib et al., "An X-Band Integrated Circuit FET Oscillator with Dielectric Resonator Stabilization", Int. J. Electronics, 1983, vol. 55, No. 4, 579–590.

Primary Examiner—Eugene R. LaRoche
Assistant Examiner—Robert J. Pascal
Attorney, Agent, or Firm—Robert J. Kraus

[57] ABSTRACT

A microwave oscillator (11) stabilized by a dielectric resonator (12) constituted by a housing (13) accommodating the dielectric resonator circuit and haing a fixing surface (14) and by a support (15) having an outer surface (16) on which the housing (13) is secured. The interface between the housing (13) and the support (15) has space-defining means (17,18,19) such that the housing (13) is subjected to flexural strain when fixed by its fixing surface (14) on the other surface (16) of the support (15).

5 Claims, 4 Drawing Figures

MICROWAVE OSCILLATOR COMPRISING A DIELECTRIC RESONATOR INSENSITIVE TO MECHANICAL VIBRATIONS

BACKGROUND OF THE INVENTION

The invention relates to a microwave oscillator stabilized by a dielectric resonator constituted on the one hand by a housing accommodating the dielectric resonator circuit and comprising a fixing surface and on the other hand by a support having an outer surface, on which the housing is secured.

The development of new materials having high dielectric constants (barium or zirconium titanate) and exhibiting very low microwave frequency losses and temperature coefficients equal to zero or slightly positive has led to the formation of a new generation of microwave oscillators, i.e. oscillators stabilized by a dielectric resonator. These oscillators operate at a fixed or slightly adjustable frequency and are characterized by a high stability with respect to the frequency and to the output level as a function of temperature, a high electric efficiency due to the use of field effect transistors, a high spectral purity and the possibility of using microband technology, thereby enabling the achievement of a small weight and a small volume.

This oscillator type is used for many applications in instrumentation, telecommunication, radar etc. In certain applications, a given spectral purity of the microwave frequency signal has to be maintained during aleatory vibrations. The mounting technology has therefore to be adapted to these limitations and more particularly the dielectric resonator has to be firmly secured on its circuit and the metallic and dielectric environment of this resonator has to be very rigid and stable because any variation of the metallic surfaces surrounding the dielectric resonator produces variations of the oscillation frequency. Especially, the distance h between the dielectric resonator and the cover of the housing is very critical in this respect. The Applicant has shown, for example, that for a distance h of 3 mm a simple differential variation $\Delta h$ of a few tens of $10^{-3}$ $\mu m$ produced a reduction of the phase noise of about 15 dB at 1 kHz of the frequency of the oscillator centred at 14 GHz. Therefore it is of major importance to design an extremely rigid housing, which cannot be realized merely by means of an increase of the metallic thicknesses without unfavourably increasing the weight and the volume of the housing.

SUMMARY OF THE INVENTION

It is an object of the invention to obviate this disadvantage in that an oscillator is used having a considerably reduced sensitivity to the vibrations applied to its support without the weight and the volume of the housing being increased.

In fact, according to the invention, a microwave oscillator stabilized by a dielectric resonator constituted on the one hand by a housing accommodating the dielectric resonator circuit and having a fixed surface and on the other hand by a support having an outer surface on which the housing is secured, is more particularly characterized in that the interface between housing and support comprises space-defining means such that the housing is subjected to flexural strain when it is fixed by its fixing surface on the outer surface of the support, while the fixing surface of the housing and the outer surface of the support remain in mechanical and electrical contact with each other. Thus subjected to strain, the housing has a much higher rigidity and a lower sensitivity to the variations applied to the support.

BRIEF DESCRIPTION OF THE DRAWING

In order that the invention may be readily carried out, it will now be described more fully, by way of example, with reference to the accompanying drawing figures, in which.

DESCRIPTION OF THE PREFERRED EMBODIMENT

Figure 1:
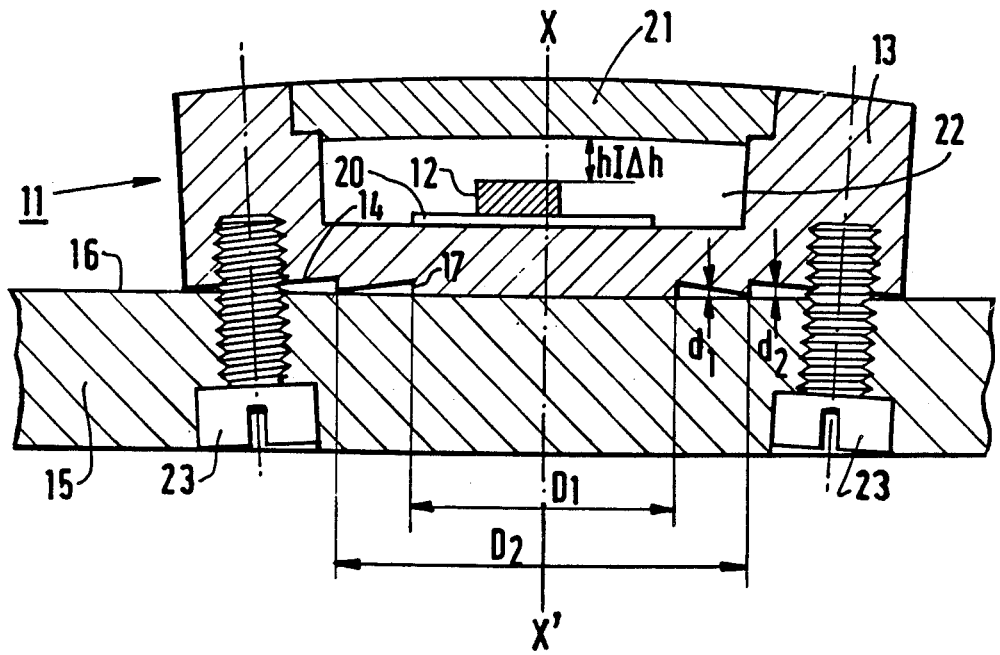
FIG. 1 is a sectional view of a first embodiment of a microwave oscillator according to the invention.

The microwave oscillator 11 shown in sectional view in FIG. 1 is of the type comprising a dielectric resonator 12. It is constituted by a circular housing 13 accommodating the dielectric resonator circuit 20, this circuit being advantageously obtained by means of the microband technology. The housing 13 also has a cover 21 enclosing hermetically the circuit 20 after the latter has been positioned and which constitutes with the other walls of the housing 13 the microwave cavity 22. The housing 13 further has a fixing surface 14. On the other hand, the microwave oscillator 11 is constituted by a support 15 having an outer surface 16, on which the housing 13 is secured, for example, by means of screws 23.

The housing 13 is made very rigid in order that under the influence of the vibrations applied to the support 15 of the oscillator the mechanical environment of the dielectric resonator 12, which in part determines the oscillation frequency, varies to the smallest possible extent. However, as indicated above, the microwave oscillator 11 shown in FIG. 1 nevertheless remains extremely sensitive to the vibrations of the support applied in the direction XX', that is to say at right angles to the surface of the circuit 20. In order to reduce this sensitivity, it is ensured, as shown in FIG. 1, that the interface between the housing 13 and the support 15 comprises space-defining means, which, in the case of FIG. 1, is constituted by a profile 17 in relief carried by the fixing surface 14. The example of FIG. 1 shows a particular profile 17 in relief obtained by forming by a metal-working process two concentric embossed parts having diameters D1, D2 and thicknesses d1, d2, respectively. When fixed by its fixing surface 14 on the outer surface 16 of the support 15, the housing 13 is thus subjected to flexural strain so that it can offer a higher resistance to the vibrations applied to the support 15, while at the same time an optimum mechanical and electrical contact is ensured at the level of the interface between the housing and the support. For this purpose, the space-defining means (in this case the embossed parts) have to be specifically adapted to the geometry of the housing, to its fixing system, to the tightening of the screws and to the kind of materials of the housing and of the support. The Applicant has realized a microwave oscillator 11 according to the invention, which for an overall diameter of 37 mm of the housing 13 had a first embossed part having a diameter D2 of 22 mm for a thickness d2 of 25 μm and a second embossed part having a diameter D1 of 14 mm for a thickness d1 of 25 μm. The experiment carried out at an oscillation frequency of 14 GHz on this oscillator has shown an improvement of 20 dB in the phase of noise for vibrations of 20 g in the band of 20 to 2000 Hz applied along the axis XX'.

Figure 2:
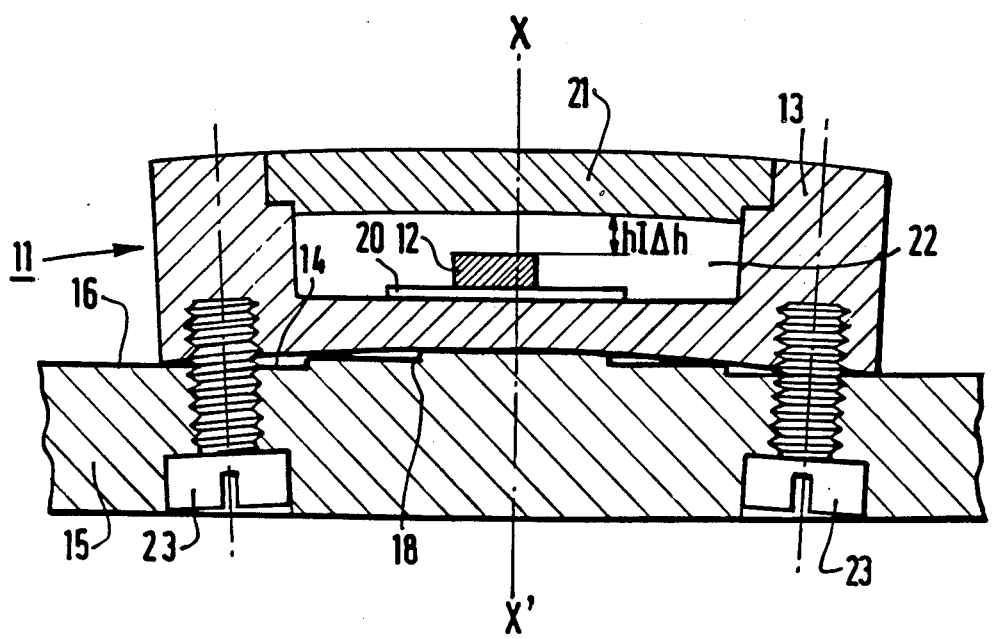
FIG. 2 is a sectional view of a second embodiment of a microwave oscillator according to the invention.
Figure 3:
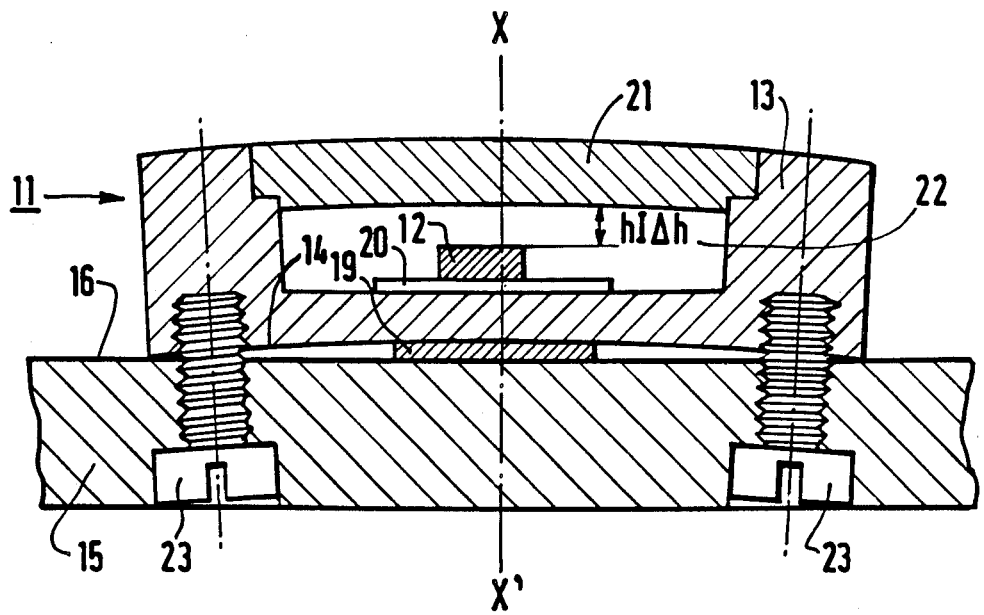
FIG. 3 is a sectional view of a third embodiment of a microwave oscillator according to the invention.

FIG. 2 is a sectional view of a second embodiment of the microwave oscillator according to the invention, in which the space-defining means is constituted by a profile in relief 18 carried in this case by the outer surface 16 of the support 15. The effects obtained by this particular embodiment are evidently identical to those produced, for example shown hereinbefore with reference to FIG. 1. Likewise, it is also envisaged, as shown in FIG. 3, that the space-defining means is constituted by a wedge 19 having a given thickness interposed between the fixing surface 14 of the housing 13 and the outer surface 16 of the support 15. Also in this embodiment, the geometry of the wedge 19 has to be such that a good mechanical and electrical contact is ensured between the housing 13 and the support 15.

Finally, it has to be emphasized that the invention is not limited to the embodiments shown in FIGS. 1, 2 and 3, in which space-defining means are constituted by discontinuous embossed parts. In fact, a person skilled in the art could design other space-defining means having a continuous or quasi continuous relief, such as a part of a sphere or a truncated cone. In fact, it is essential that the metallic walls of the housing are subjected to strain in order to increase the rigidity thereof and to ensure a perfect mechanical and electrical contact between the fixing surface of the housing and the outer surface of the support.

Figure 4:
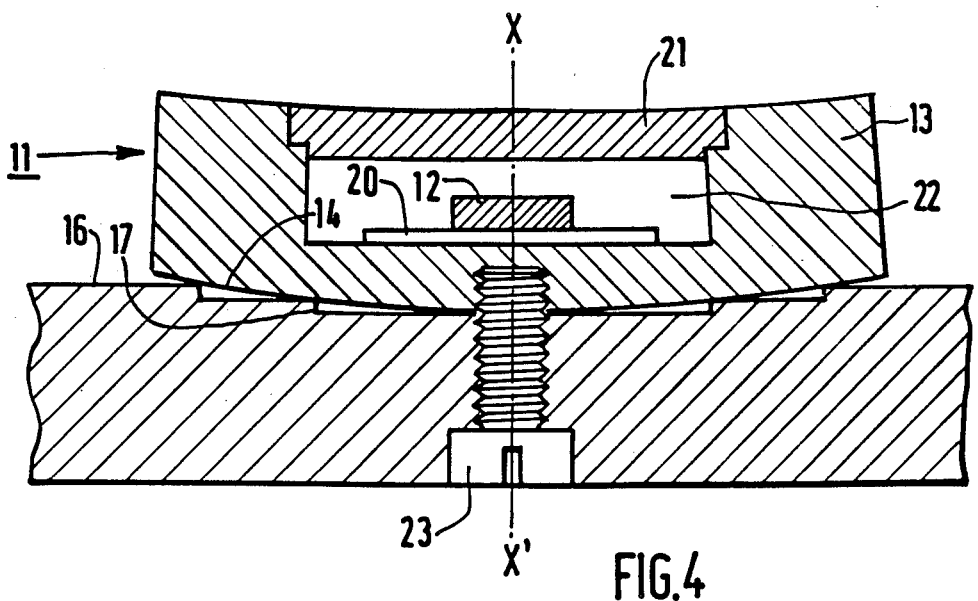
FIG. 4 is a sectional view of a fourth embodiment of a microwave oscillator according to the invention.

Further, it has also to be stated that the invention is applicable irrespective to the concavity produced by the flexion on the housing. As shown in FIG. 4, it can be envisaged that concave space-defining means act upon the edges of the housing 13 with tightening in the central part of the housing.

What is claimed is:

1. An arrangement for minimizing the effect of vibration of the operating frequency of a dielectric resonator, said arrangement comprising:
   (a) a housing having opposed first and second inner surfaces and an outer surface all extending transversely of a common axis, one of said inner surfaces being adapted for mounting the dielectric resonator in the vicinity of the axis;
   (b) a support body having an outer surface extending transversely of the axis on which the housing is supported, said outer surface of the support body and the outer surface of the housing facing each other; and
   (c) means for producing flexural strain in the housing when it is affixed to the support body, said means comprising:
      (1) space-defining means for defining a space between predefined respective portions of the facing outer surfaces, said space including at least one location where said facing outer surfaces can be forced together to effect flexion of the housing; and
      (2) affixing means, disposed at said at least one location, for locally forcing together the facing outer surfaces.

2. An arrangement as in claim 1 where the space-defining means comprises a raised portion of at least one of said facing surfaces.

3. An arrangement as in claim 1 where the space-defining means comprises a depressed portion of at least one of said facing surfaces.

4. An arrangement as in claim 1 where the space-defining means comprises a separate spacing element disposed between the facing surfaces.

5. An arrangement as in claim 1, 2, 3 or 4 where said arrangement comprises a dielectric-resonator-stabilized microwave oscillator.

* * * * *